(12) United States Patent
Strangman

(10) Patent No.: US 7,211,338 B2
(45) Date of Patent: May 1, 2007

(54) HARD, DUCTILE COATING SYSTEM

(75) Inventor: Thomas E. Strangman, Prescott, AZ (US)

(73) Assignee: Honeywell International, Inc., Morristown, NJ (US)

( * ) Notice: Subject to any disclaimer, the term of this patent is extended or adjusted under 35 U.S.C. 154(b) by 188 days.

(21) Appl. No.: 10/741,034

(22) Filed: Dec. 19, 2003

(65) Prior Publication Data
US 2007/0065679 A1 Mar. 22, 2007

(51) Int. Cl.
*B32B 9/00* (2006.01)

(52) U.S. Cl. .................. 428/698; 428/212; 428/332; 428/469; 428/472

(58) Field of Classification Search ................ 428/469, 428/472, 332, 212, 698; 75/243
See application file for complete search history.

(56) References Cited

U.S. PATENT DOCUMENTS

| | | | |
|---|---|---|---|
| 2,899,338 A | | 8/1959 | Goetzel et al. |
| 3,669,695 A | * | 6/1972 | Iler |
| 3,900,592 A | * | 8/1975 | Kennedy et al. ............ 428/212 |
| 4,065,301 A | * | 12/1977 | Tanaka et al. ................ 75/238 |
| 4,226,082 A | * | 10/1980 | Nishida et al. |
| 4,252,862 A | * | 2/1981 | Nishida ...................... 428/472 |
| 4,403,014 A | * | 9/1983 | Bergmann ................. 428/546 |
| 4,415,421 A | * | 11/1983 | Sasanuma |
| 4,422,874 A | * | 12/1983 | Nishimura et al. ........... 75/238 |
| 4,514,224 A | * | 4/1985 | Nishigaki .................... 75/238 |
| 4,574,011 A | * | 3/1986 | Bonjour et al. ............... 75/241 |
| 4,589,917 A | * | 5/1986 | Nagato ....................... 75/238 |
| 4,591,418 A | * | 5/1986 | Snyder |
| 4,680,438 A | * | 7/1987 | Witting et al. |
| 4,707,238 A | * | 11/1987 | Okubo |
| 4,745,035 A | * | 5/1988 | Saurer et al. ................ 428/614 |
| 4,839,245 A | * | 6/1989 | Sue et al. |
| 4,849,079 A | | 7/1989 | Cuomo et al. |
| 4,973,388 A | * | 11/1990 | Francois et al. |
| 5,185,211 A | * | 2/1993 | Sue et al. |
| 5,242,753 A | * | 9/1993 | Sue et al. |
| 5,510,012 A | * | 4/1996 | Schulz et al. |
| 5,603,075 A | * | 2/1997 | Stoll et al. .................. 428/552 |
| 6,007,390 A | * | 12/1999 | Cheng et al. ............... 428/673 |

FOREIGN PATENT DOCUMENTS

| | | | |
|---|---|---|---|
| EP | 520465 | * | 12/1992 |
| GB | 1309634 A | | 3/1973 |
| GB | 2117009 | * | 10/1982 |

OTHER PUBLICATIONS

PCT International Search Report PCT/US04/42612, Oct. 7, 2005.
W. Janeff, "Herstellung von Metallnitriden in der Glimmentladung und einige Ihrer Eigenschaften", Zeitschrift Fur Physik, 1955, p. 619-636, vol. 142 No. 5.

* cited by examiner

Primary Examiner—Archene Turner
(74) Attorney, Agent, or Firm—Ingrassia Fisher & Lorenz

(57) ABSTRACT

The invention provides hard, ductile coatings comprising a ductile bonding layer of zirconium or titanium alloyed with a precious metal and a hard, surface layer comprising at least one compound selected from the group consisting of zirconium nitride, titanium nitride, zirconium carbide and titanium carbide and a precious metal segregated into the grain boundaries. The present invention also provides hard ductile multilayer coatings comprised of alternating ductile metal and hard nitride or carbide layers. The invention also includes methods to manufacture nitride or carbide coatings with ductile precious metal grain boundaries. The coatings provide an erosion resistant coating to surfaces to which they are applied.

16 Claims, 4 Drawing Sheets

HARD, DUCTILE COATING SYSTEM

BACKGROUND OF THE INVENTION

The invention relates in general to erosion resistant coatings and, more particularly, to hard ductile coatings having a layer of titanium nitride, titanium carbide, zirconium nitride or zirconium carbide with precious metal grain boundaries.

Erosion resistant coatings are used to coat a number of tools and parts. Of particular interest is the use of such coatings in the fabrication of compressor hardware for gas turbine engines. Such hardware includes blades and vanes in the compressor of a gas turbine engine.

Efficient compressor operation demands the maintenance of the original compressor hardware geometry. The compressor blades and vanes have airfoil shapes with relatively sharp edges. Gas turbine engines ingest vast quantities of air and this air will inevitably include some amount of particulate material. In the case of aircraft, this may be sand from the runway. Such materials are very abrasive and erosive when they impact compressor hardware at high speeds. The erosion process is detrimental as it reduces the compressor efficiency because of the degradation of the starting airfoil geometry.

Recently, physical and chemical vapor deposited coatings, such as titanium nitride coatings and zirconium nitride coatings have been used to provide a protective layer having good hardness characteristics. U.S. Pat. No. 4,839,245 discloses a zirconium nitride coating in which the average grain size of the zirconium nitride is not greater than about 3000 Angstroms. This grain size of the zirconium nitride is critical in order to produce an effective erosion resistant coating, particularly to prevent damage from high velocity particles hitting a coated article at a 90° angle. While the coating of the '245 patent shows erosion from high velocity particles hitting the coating at 20° and 90°, the coatings are only two-fold more resistant than other coatings known in the art.

U.S. Pat. No. 5,242,753 likewise discloses a zirconium nitride coating wherein the coating has a substoichiometric amount of nitrogen. However, the coating shows erosion and wear resistance over a narrow range of the substoichiometric nitrogen. Optimal erosion resistance is obtained when the nitrogen is at about 41–42 atomic %, with the resistance dropping off sharply on either side of the range.

Finally, U.S. Pat. No. 5,185,211 discloses a titanium nitride coating with non-stoichiometric amounts of nitrogen. As with the coating of the '743 patent, the coating of the '211 patent shows erosion and wear resistance over a narrow range of nitrogen in the titanium nitride. Optimal erosion resistance is obtained when the nitrogen is at about 38–40 atomic %, with the resistance dropping off sharply on either side of the range.

Although the coatings of the prior art have hardness characteristics, they exhibit inherently brittle behavior and their erosion resistance at normal impact decreases markedly with increasing hardness and particle size of the high velocity particulate material. It has been observed that dynamic impact of high velocity particulate materials onto a coated surface of an article can result in micro-deformations, and associated lateral and/or median cracks around the impact site, decreasing the effectiveness of the coating and the useful life span of the coated article.

U.S. Pat. No. 4,591,418 discloses a coating having alternating microscopically thin layers of titanium nitride and a gold alloy. The titanium nitride layers and the gold layers are distinct, unmixed layers. Furthermore, the '418 patent teaches the disadvantages of co-deposition titanium and gold together in the presence of nitrogen because of the formation of gold-titanium intermetallic compounds. Additionally, the coatings of the '418 patent are for manufacturing golden colored articles and, therefore have no need to be erosion resistant to high velocity large particulate materials. In fact, as gold is a 'soft' metal and is on the surface of the coating, one would not anticipate that the coating of the '418 patent could be used as an erosion resistant coating.

U.S. Pat. No. 4,680,438 discloses a laminated material for electrical contacts having a surface contact layer of titanium nitride which is then overlaid with a mixed layer of titanium nitride and a precious metal. The composition in the mixed layer is 5–60% titanium and 40–95% of the precious metal. Additionally, the concentration of precious metal in the layer is preferably a gradient, wherein the concentration of the precious metal is low at the junction with the titanium nitride contact layer, increasing to the surface of the coating. There is no teaching in the '438 patent for using the laminated material as an erosion resistant coating to prevent erosion by high velocity particulate material. As gold is a 'soft' metal and the amount of gold in the laminated material is high, the laminated material of the '438 patent would not be suitable as an erosion resistant coating.

As can be seen, there is a need for coatings with excellent adhesion and ductility that can protect parts from erosion by high velocity particles and accommodate microdeformation of the component's surface by the impact of large particles without spalling or cracking.

SUMMARY OF THE INVENTION

In one aspect of the present invention, there is provided an erosion resistant coating comprising a layer comprising zirconium nitride, zirconium carbide, titanium nitride or titanium carbide. The layer includes up to about 4 wt % of a precious, non-nitride or non-carbide forming metal distributed into the grain boundaries of the layer. The precious, non-nitride or non-carbide forming metal can be gold, silver, palladium, platinum, ruthenium, rhodium, iridium, nickel or cobalt.

In another aspect of the present invention, there is provided an erosion resistant coating having a first and a second layer. The first, ductile layer is metallic and may promote bonding to the substrate. The first layer comprises zirconium or titanium and up to about 4 wt % of a precious, non-nitride or non-carbide forming metal. The second, hard layer comprises zirconium nitride, zirconium carbide, titanium nitride or titanium carbide, wherein the second layer also includes up to about 4 wt % of a precious, non-nitride or non-carbide forming metal distributed into the grain boundaries of the layer. The precious, non-nitride or non-carbide forming metal for either the first or second layer can be gold, silver, palladium, platinum, ruthenium, rhodium, iridium, nickel or cobalt. The erosion resistant coating of the present invention may further comprise multiple layers, wherein said multiple layers comprise alternating first and second layers.

In still another aspect of the present invention, there is provided a coated article having an erosion and wear resistant coating. The coating comprises zirconium nitride, zirconium carbide, titanium nitride or titanium carbide and up to about 4 wt % of a precious, non-nitride or non-carbide forming metal. The precious, non-nitride or non-carbide forming metal is distributed into the grain boundaries of the layer. The precious, non-nitride or non-carbide forming metal can be gold, silver, palladium, platinum, ruthenium, rhodium, iridium, nickel or cobalt. The article can be, for example, but not limited to, compressor airfoils or foil bearings of gas turbine engines and turbochargers.

In yet another aspect of the present invention, there is provided a coated article having an erosion and wear resistant coating. The coating has a first and second layer. The first layer is metallic and may promote bonding to the substrate. The first layer comprises zirconium or titanium and up to about 4 wt % of a precious, non-nitride or non-carbide forming metal. The second layer comprises zirconium nitride, zirconium carbide, titanium nitride or titanium carbide, wherein the second layer also includes up to about 4 wt % of a precious, non-nitride or non-carbide forming metal distributed into the grain boundaries of the layer. The precious, non-nitride or non-carbide forming metal for either the first or second layer can be gold, silver, palladium, platinum, ruthenium, rhodium, iridium, nickel, or cobalt. The article can be, for example, but not limited to, compressor airfoils or foil bearings of gas turbine engines and turbochargers.

In another aspect of the present invention, there is provided a method for making an erosion resistant coating, the method comprising: providing a substrate; depositing a nitride- or carbide-forming metal alloyed with a precious, non-nitride or non-carbide forming metal onto the substrate; and forming a layer comprising a metal nitride or carbide and up to 4 wt % of the precious, non-nitride or non-carbide forming metal. The nitride- or carbide forming metal can be either zirconium, a zirconium alloy, titanium, or a titanium alloy. The zirconium alloy may comprise Ti, Hf, V, Nb, Ta, Cr, Mo, W or Al while the titanium alloy may comprise Zr, Hf, V, Nb, Ta, Cr, Mo, W or Al. The precious, non-nitride or non-carbide forming metal can be gold, silver, palladium, platinum, ruthenium, rhodium, iridium, nickel or cobalt. The step of depositing the metal and precious, non-nitride or non-carbide forming metal onto the substrate can be either chemical or physical vapor deposition. The method may further comprise the step of depositing a the nitride- or carbide-forming metal alloyed with up to 4 wt % precious, non-nitride or non-carbide forming metal onto the component in a nitriding- or carburizing-gas environment to form a nitride or carbide layer with the ductile precious, non-nitride or non-carbide forming metal segregated to the nitride or carbide grain boundaries.

In still another aspect of the present invention, there is provided a method for making an erosion resistant coating comprising; providing a substrate; placing the substrate in a chamber containing a nitride- or carbide-forming metal vapor source, a precious, non-nitride or non-carbide forming metal vapor source, and a nitriding- or carburizing-gas mixture (e.g., nitrogen or methane). The nitride- or carbide-forming metallic vapor source may be a solid (sputtering target) or molten pool of zirconium, a zirconium alloy, titanium, or titanium alloy. The precious, non-nitride or non-carbide forming metal vapor may come from a separate source or the precious, non-nitride or non-carbide forming metal may be attached to or alloyed with the nitride- or carbide-forming metal source. Both the metal from the nitride- or carbide-forming metal vapor source and the precious, non-nitride or non-carbide forming metal source are evaporated simultaneously to produce a vapor comprising the metal and the precious, non-nitride or non-carbide forming metal. A first ductile metal layer is deposited in the absence of the nitriding- or carburizing-gas in the evaporation chamber. A second nitride- or carbide-layer with up to about 4 wt % precious, non-nitride or non-carbide forming metal segregated to the grain boundaries is formed in the presence of the nitriding- or carburizing-gas during deposition. The substrate can be composed of any metal that can be coated with a titanium nitride or carbide or a zirconium nitride or carbide coating. The substrate can be composed of titanium, iron, nickel, or aluminum. The metal vapor source can have either elemental zirconium or titanium or alternatively, the metal vapor source can have titanium or zirconium alloys. The methods can be either physical or chemical vapor deposition. For example, but not limited to, the methods for producing the metallic vapor for the coatings can be cathodic arc sputtering or e-beam evaporation.

The method can further comprise the step of forming a second layer onto the nitride or carbide layer by removing the nitrogen or methane gas from the chamber, said second layer comprising the metal and precious, non-nitride or non-carbide forming metal. Multiple alternating layers can be formed on the substrate by adding or removing the nitrogen or methane gas from the chamber.

In yet another aspect of the present invention, there is provided a method for producing a coated article comprising the steps of: providing an article; depositing a nitride- or carbide-forming metal alloyed with up to 4 wt % of a precious, non-nitride or non-carbide forming metal onto the surface of the article and forming a layer comprising a metal carbide or nitride and up to 4 wt % of a precious, non-nitride or non-carbide forming metal. The metal is either zirconium, an alloy of zirconium, titanium, or an alloy of titanium; and the precious, non-nitride or non-carbide forming metal can be gold, silver, palladium, platinum, ruthenium, rhodium, iridium, nickel or cobalt. The article can be, but not limited to, a compressor airfoil or a foil bearing.

In still another aspect of the present invention, there is provided a method for producing a coated article comprising the steps of: providing an article; placing the article in a chamber containing one or more metal vapor sources of nitride- or carbide-forming metal or alloy and a precious, non-nitride or non-carbide forming metal vapor source, wherein the metal is zirconium, titanium or alloys thereof; forming a first layer ductile metallic layer comprising a zirconium or titanium alloy with up to 4 wt % precious, non-nitride or non-carbide forming metal; and forming a second layer comprising a metal nitride or carbide and the precious, non-nitride or non-carbide forming metal on the first-layer by adding a nitriding- or carburizing-gas to the chamber and simultaneously evaporating the metal from the metal-based vapor source or sources. The method may further comprise the step of forming additional first and second layers cyclically introducing and removing the nitriding- or carburizing-gas from the chamber while evaporating the nitride- or carbide-forming metal and precious, non-nitride or non-carbide forming metal from the vapor source or sources. The metal vapor source can have either elemental zirconium or titanium or alternatively, the metal vapor source can have titanium or zirconium alloys. The evaporated metallic vapor may be ionized and electrically attracted to the substrate to enhance coating deposition efficiency and bonding. The article can be any article that requires an erosion resistant or a wear resistant coating. The article can be, by way of non-limiting example, a compressor airfoil or a foil bearing.

These and other features, aspects and advantages of the present invention will become better understood with reference to the following drawings, description and claims.

DETAILED DESCRIPTION OF THE INVENTION

Figure 1:
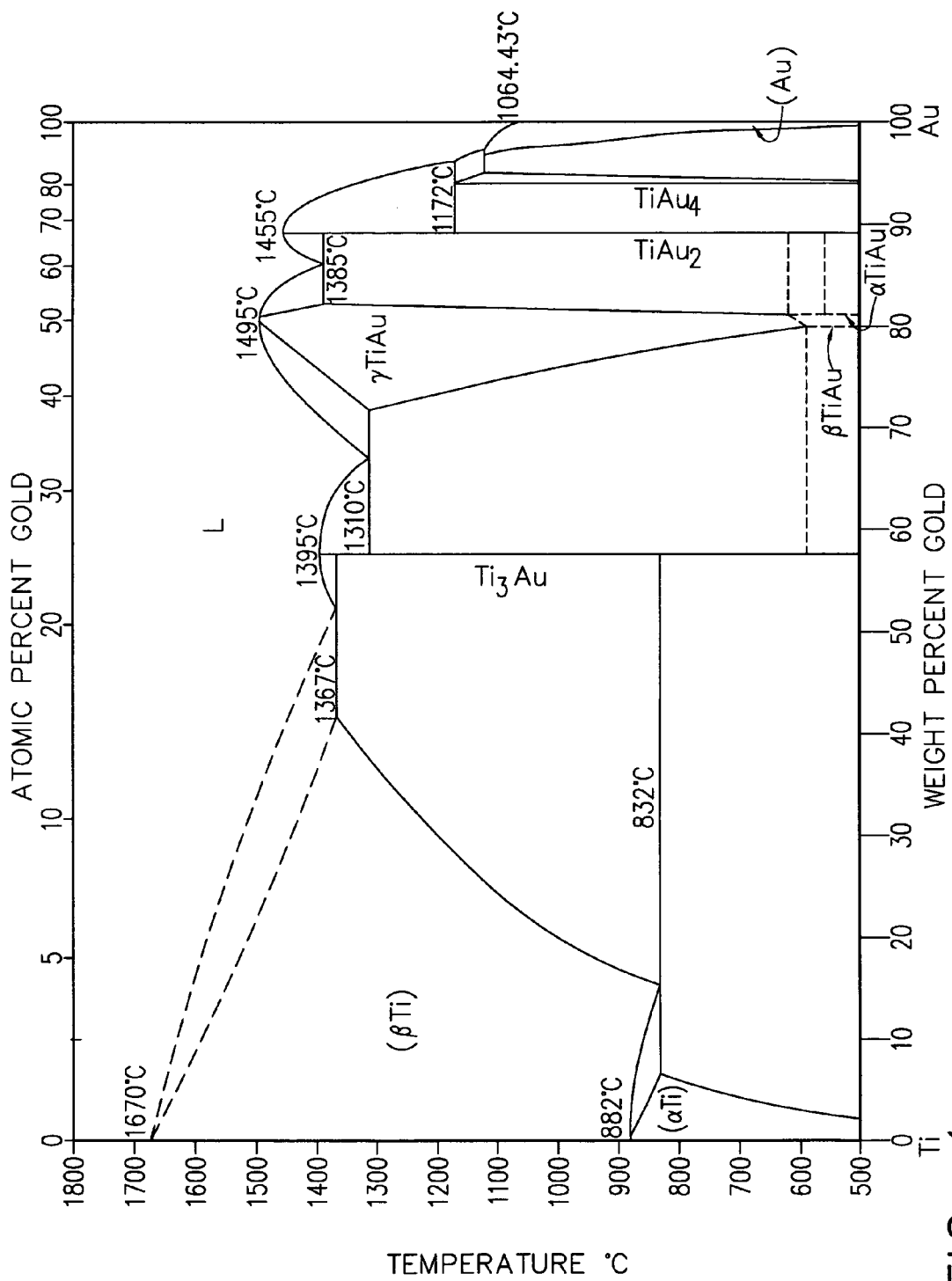
FIG. 1 is a phase diagram for titanium and gold.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides an erosion resistant coating, wherein the coating has a layer comprising a metal nitride or carbide, wherein the metal is zirconium or titanium, and up to about 4 wt % of a precious, non-nitride or non-carbide forming metal distributed into the grain barriers of the layer. The precious, non-nitride or non-carbide forming metal can be gold, silver, palladium, platinum, ruthenium, rhodium, iridium, nickel or cobalt. The coating may further have a ductile metallic layer comprising zirconium or titanium and up to about 4 wt % of the precious, non-nitride or non-carbide forming metal. The presence of the ductile layer at the interface between the substrate and the erosion resistant layer may enhance bonding of the layers to the substrate.

The present invention also provides an article coated with an erosion resistant coating. The coating of the present invention can be deposited onto substrate materials that can be coated with nitride or carbide coatings such as, but not limited to, iron, nickel, aluminum or titanium. While the coating of the present invention can be applied to any article requiring an erosion resistant coating or a wear resistant surface, it is contemplated that the coatings would be particularly useful for coating parts of gas turbine engines, specifically the compressor airfoil or foil bearings. During operation, these engines are subjected to high velocity particles hitting the compressor airfoils, eventually damaging the engines. The coatings of the present invention are intended to increase the lifetime of compressor airfoils by enabling the coating to withstand the micro-deformation associated with the impact of high velocity particles.

The present invention, in contrast to the prior art, provides an erosion resistant coating comprising a metal nitride or carbide layer having up to about 4 wt % of a precious, non-nitride or non-carbide forming metal. The layer can be formed by a deposition process, such as physical or chemical vapor deposition, in the presence of nitrogen or methane gas. The coating can also have a ductile metallic layer comprising zirconium or titanium with up to about 4 wt % of a precious, non-nitride or non-carbide forming metal. The ductile layer can also be formed by the same deposition process as the carbide or nitride layer, but in the absence of the nitrogen or methane gas.

The present invention provides coatings comprising a layer having a compound selected from the group consisting of titanium nitride, titanium carbide, zirconium nitride and zirconium carbide. Additional nitrides or carbides may be present in the coating when the metallic vapor source is an alloy. Titanium or zirconium alloys may comprise Hf, V, Nb, Ta, Cr, Mo, W, and Al, in addition to titanium or zirconium. The layer further comprises a precious, non-nitride or non-carbide forming metal. The precious, non-nitride or non-carbide forming metal can be selected from the group consisting of gold, silver, palladium, platinum, ruthenium, rhodium, iridium, nickel or cobalt; preferably, the precious metal is gold. The precious, non-nitride or non-carbide forming metal can be present in amount that is up to about 4 wt % of the layer.

Figure 2:
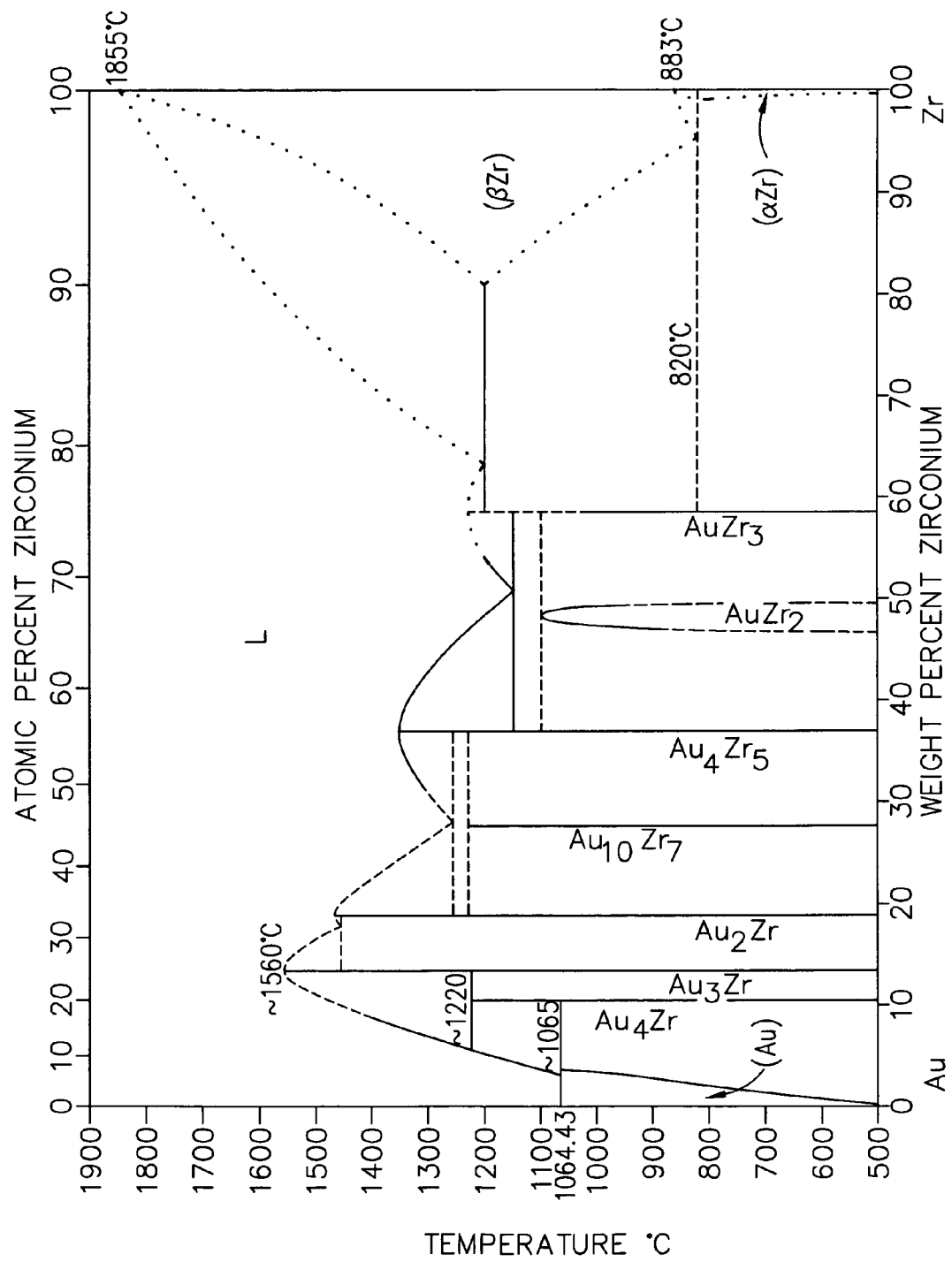
FIG. 2 is a phase diagram for zirconium and gold.

The precious, non-nitride or non-carbide forming metal in the nitride or carbide layer segregates to the grain boundaries for enhancement of ductility and resistance to fracture. In contrast, titanium plus precious, non-nitride or non-carbide forming metal or zirconium plus precious, non-nitride or non-carbide forming metal layers within the coating are expected to be ductile when the precious, non-nitride or non-carbide forming metal is in solid solution. For example, the phase diagram for titanium and gold indicates that the amount of gold in the layer can be up to about 4 wt %, with a more optimal amount being from about 0.1 wt % to about 2 wt % (FIG. 1). At the 4 wt % concentration of gold, a few percent of the $Ti_3Au$ intermetallic phase is predicted; small concentrations of this intermetallic phase are considered to provide acceptable ductility. However, the phase diagram for zirconium and gold shows a narrower range for the amount of gold to have a solid solution (FIG. 2). With zirconium, the amount of gold can be up to about 4 wt %, with a more optimal amount being about 0.1 to 1 wt %. At the higher concentration of Au, a few percent of the $Zr_3Au$ intermetallic phase is predicted; small concentrations of this intermetallic phase are considered to be acceptable. Also, alloying additions to titanium or zirconium that fully or partially stabilize the high-temperature $\beta$ (Ti, Zr) phase increase their solubility limit for gold or other precious, non-nitride or non-carbide forming metals, relative to the low-temperature $\alpha$ (Ti, Zr) phase.

Figure 3:
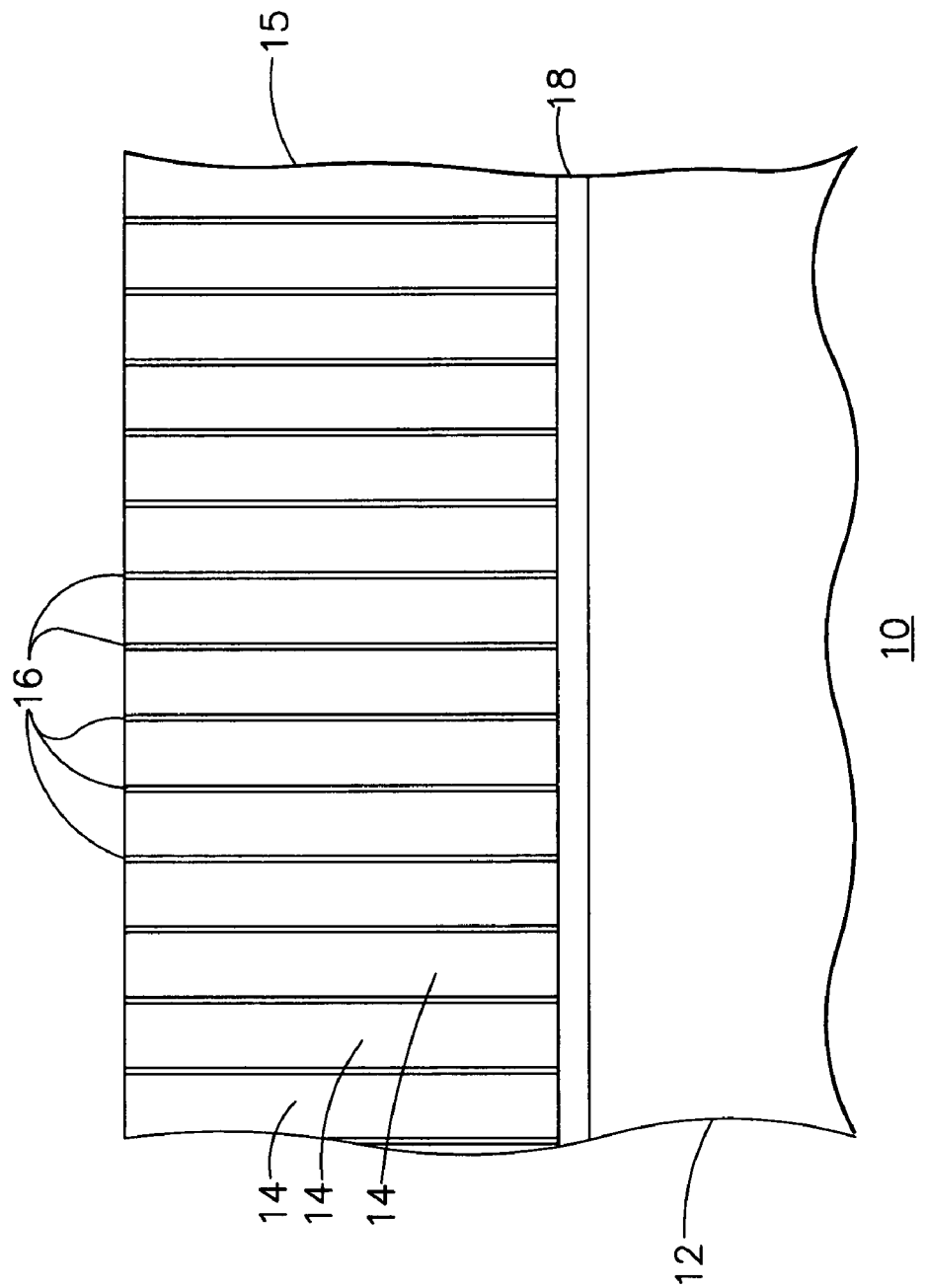
FIG. 3 is a schematic view illustrating a hard ductile coating with gold in the grain boundaries according to the present invention.

The precious, non-nitride or non-carbide forming metal in the coating is present as submicron grain boundaries, typically less than about 200 nanometers thick, between the hard nitride grains. FIG. 3 illustrates an exemplary distribution of gold grain boundaries in a zirconium nitride layer. In the example shown in FIG. 3, the substrate 12, having a metallic bonding layer 18 comprising zirconium with 1 wt % gold, is coated with a layer 15 comprising zirconium nitride grains 14 with gold segregated to the grain boundaries 16 of the zirconium nitride. The presence of the precious, non-nitride or non-carbide forming metal grain boundaries 16 ductilizes the hard zirconium nitride coating, enabling the coating to undergo limited deformation required to survive impact by high velocity particles, particularly particles greater than 10 microns that contact high-speed airfoils at relative velocities of about 1500 ft/sec. Alternatively, the present invention provides coatings which enhance wear resistance of rubbed surfaces such as, but not limited to, foil bearings. As the surfaces rub and the coating wears, an atomic layer of the precious metal from the grain boundaries may adhere to the rubbed surface, reducing the friction between the surfaces. The thickness of the coating can be dependent on the size of the substrate and its ultimate use. As an example, the coating may be no more than 20 microns thick when applied as an erosion resistant coating for compressor airfoils or foil bearings. Many coatings will be from about 3 microns to about 10 microns thick when applied to these types of components.

Methods for depositing the coating onto a substrate can include physical and chemical vapor deposition, as commonly used in the art. For example, cathodic arc sputtering and electron beam evaporation-physical vapor deposition (EB-PVD) can be used to apply the coatings of the present invention. A metal vapor source of elemental titanium or zirconium can be evaporated and deposited in the presence of a nitriding- or carburizing-gas to produce a nitride or carbide, respectively, on the surface of the substrate. The nitriding- or carburizing-gas may be, but not limited to, nitrogen or methane, respectively. Alternatively, the metal base target may have titanium or zirconium alloys. There are many commercial alloys known to the skilled artisan, including, but not limited to, alloys with aluminum, vanadium and hafnium. The amount of nitrogen or methane gas should be sufficient for approximately all of the titanium or zirconium metal to react to produce nitride or carbide compounds on the substrate surface. Full conversion of the titanium or zirconium to the carbide or the nitride is desirable to avoid the formation of brittle intermetallic phases within the grain boundaries, which would occur if the precious, non-nitride or non-carbide forming metal could react with residual titanium or zirconium. The precious, non-nitride or non-carbide forming metal is vaporized simultaneously with the titanium or zirconium and deposited onto the substrate at the same time. The precious, non-nitride or non-carbide forming metal vapor may come from a separate source or the precious, non-nitride or non-carbide forming metal may be attached to or alloyed with the nitride- or carbide-forming metal source. Ionization of the coating vapor during coating is desirable because it permits the charged vapor to be electrically attracted to an electrically biased substrate for enhanced bonding and improved deposition efficiency, which reduces the cost of coating.

The present invention also provides hard ductile coatings having two or more layers. The presence of a ductile layer may further enhance the ductility of the coating, enabling the coating to survive impact by larger particles at higher velocity with minimal or no chipping or spalling. A first hard layer or layers within the coating system may comprise a compound selected from the group consisting of zirconium nitride, zirconium carbide, titanium nitride and titanium carbide, along with a precious, non-nitride or non-carbide forming metal. A second ductile layer or layers within the coating system may comprise zirconium or titanium, which is not converted to the nitride or the carbide, and a precious, non-nitride or non-carbide forming metal. The precious, non-nitride or non-carbide forming metal in either layer can be selected from the group consisting of gold, silver, palladium, platinum, ruthenium, rhodium, iridium, nickel and cobalt; preferably, the precious metal is gold. The precious, non-nitride or non-carbide forming metal can be present in both layers up to about 4 wt % of the respective layer.

Figure 4:
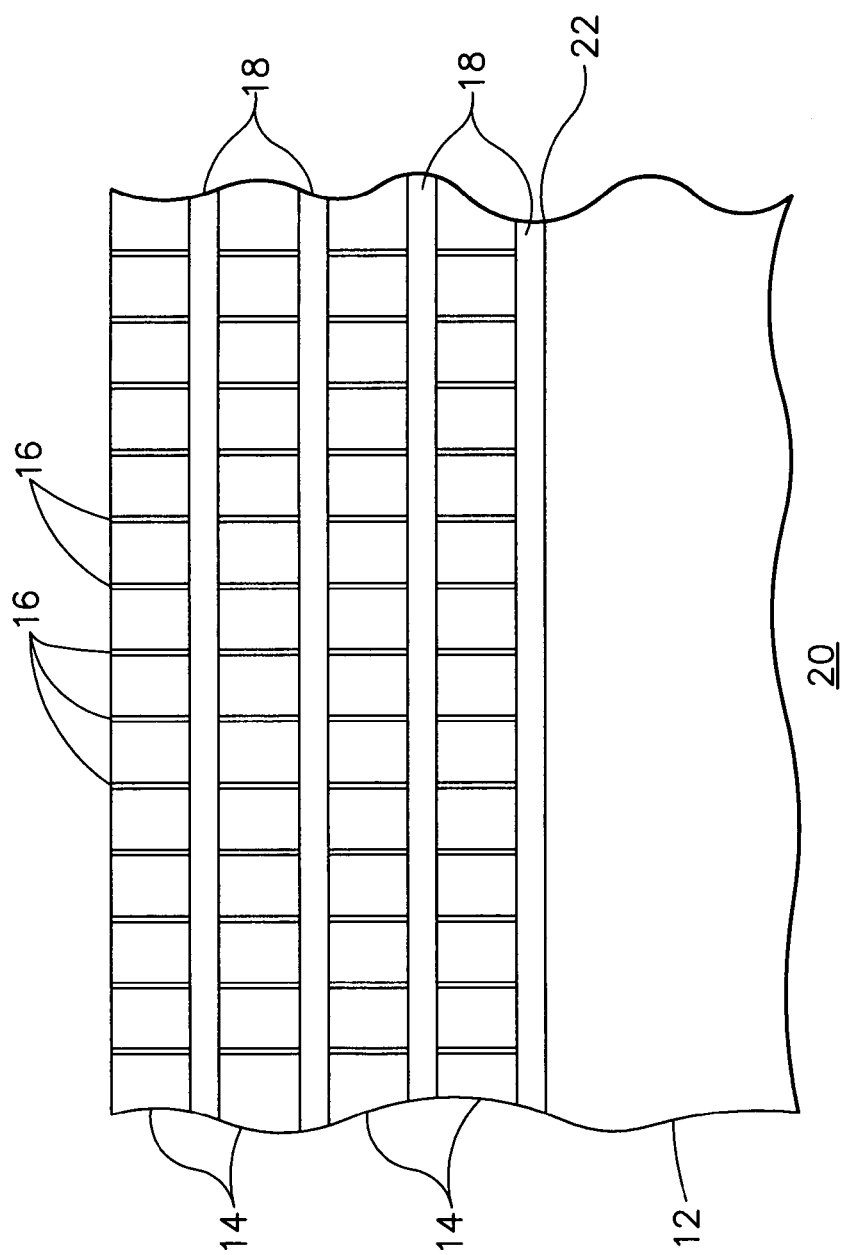
FIG. 4 is a schematic view illustrating a hard ductile coating having multiple layers according to the present invention.

An example of a multilayer coating 20 of the present invention is illustrated in FIG. 4. The coating can be applied to a substrate 12, wherein the coating has multiple, alternating layers of, for example, a titanium nitride layer 14 with 1 wt % gold and, for example, a titanium layer 18 having 1 wt % gold. The gold in the titanium nitride layer 14 can be segregated to the grain boundaries 16. A metallic bond 22 to the substrate 12 can be achieved by the deposition of the first titanium layer 18 onto the substrate 12. The hard nitride layer 14 of the coating 20 is on the surface of the coating.

The two or more layered coatings of the present invention can be deposited onto substrate materials similar to the single layer embodiment above, as well as using similar methods. As described above for the single layer coating, elemental titanium or zirconium can be vaporized and deposited onto the substrate in the presence of nitriding- or carburizing-gas, such as nitrogen or methane, to produce a nitride or carbide, respectively, on the surface of the substrate. Alternatively, titanium or zirconium alloys may also be used. The flow of nitrogen or methane gas can be constant, allowing for approximately all of the titanium or zirconium metal to be converted to the nitride or carbide. The precious, non-nitride or non-carbide forming metal can be vaporized simultaneously with the titanium or zirconium and deposited onto the substrate at the same time.

In the event that the coating contains more than two layers, the layers can be deposited in an alternate fashion by turning the nitrogen or methane gas on or off during deposition until the desired coating thickness is achieved. The number of layers will be determined by the desired thickness of the coating. FIG. 4 schematically illustrates the alternating of layers in a coating. The individual layers, as well as the entire coating, may vary in thickness. Oftentimes, the layers comprising the nitride and carbide will be thicker than the ductile metallic layers. For example, the nitride or carbide layer can be from about 0.5 microns to about 5 microns in thickness, while the second layer will be about 0.1 to 2 microns in thickness. The maximum useful thickness for this multilayer coating is about 30 microns. Multilayer coating thicknesses in the 3 to 15 micron range are preferred.

It should be understood, of course, that the foregoing relates to embodiments of the invention and that modifications may be made without departing from the spirit and scope of the invention as set forth in the following claims.

I claim:

1. A coating comprising:
    a bonding layer comprising at least one metal selected from the group consisting of zirconium and titanium, and further comprising up to about 4 wt % of a first distributed metal selected from the group consisting of a precious metal, a non-nitride forming metal, and a non-carbide forming metal;
    an erosion resistance layer formed on the bonding layer, the erosion resistance layer comprising at least one compound selected from the group consisting of zirconium nitride, titanium nitride, zirconium carbide and titanium carbide, and further comprising up to about 4 wt % of a second distributed metal that is distributed into grain boundaries of the erosion resistance layer, the second distributed metal selected from the group consisting of a precious metal, a non-nitride forming metal, and a non-carbide forming metal.

2. The coating of claim 1 wherein each of the first and second distributed metals is selected from the group consisting of gold, silver, palladium, platinum, ruthenium, rhodium, iridium, nickel and cobalt.

3. The coating of claim 2 wherein the precious metal is gold.

4. The coating of claim 1 wherein each of the first and second distributed metals is from about 0.1 wt % to about 2 wt % of the bonding and erosion resistance layers, respectively.

5. The coating of claim 1 wherein the erosion resistance layer has a thickness of from about 3 microns to about 20 microns.

6. The coating of claim 1 wherein:
    the erosion resistance layer has a thickness of from about 0.5 microns to about 20 microns and;
    the bonding layer has a thickness of from about 0.1 to about 2 microns.

7. The coating of claim 1 wherein the coating comprises greater than two alternating layers of the bonding layer and the erosion resistance layer.

8. The coating of claim 7 wherein the coating is up to about 30 microns thick.

9. The coating of claim 7 wherein the coating is from about 3 microns to about 15 microns thick.

10. An article, comprising:
a substrate;
a bonding layer on the substrate, the bonding layer comprising at least one metal selected from the group consisting of zirconium and titanium, and further comprising up to about 4 wt % of a first distributed metal selected from the group consisting of a precious metal a non-nitride forming metal, and a non-carbide forming metal;
an erosion resistance layer on said substrate, said erosion resistance layer comprising at least one compound selected from the group consisting of zirconium nitride, titanium nitride, zirconium carbide and titanium carbide, and further comprising up to about 4 wt % of a second distributed metal selected from the group consisting of a precious metal, a non-nitride forming metal, and a non-carbide forming metal, wherein said second distributed metal is distributed into grain boundaries of the erosion resistance layer.

11. The article of claim 10 wherein the article is a foil bearing.

12. The article of claim 10 wherein each of the first and second distributed metals is selected from the group consisting of gold, silver, palladium, platinum, ruthenium, rhodium, indium, nickel, and cobalt.

13. The article of claim 12 wherein the precious metal is gold.

14. The article of claim 10 wherein:
said erosion resistance layer has a thickness of from about 0.5 microns to about 5.0 microns and;
said bonding layer has a thickness of from about 0.1 to about 2.0 microns.

15. The article of claim 10 wherein the coating comprises additional alternating layers of the bonding layer and the erosion resistance layer, wherein the erosion resistance layer is an exposed surface of the article.

16. The article of claim 10 wherein the article is an airfoil.

* * * * *